United States Patent [19]
Teo et al.

[11] Patent Number: 5,624,871
[45] Date of Patent: Apr. 29, 1997

[54] METHOD FOR MAKING ELECTRICAL LOCAL INTERCONNECTS

[75] Inventors: Yeow M. Teo; Kah S. Seah; Lap Chan; Che-Chia Wei, all of Singapore, Singapore

[73] Assignee: Chartered Semiconductor Manufacturing Pte LTD, Singapore, Singapore

[21] Appl. No.: 699,222

[22] Filed: Aug. 19, 1996

Related U.S. Application Data

[63] Continuation of Ser. No. 299,457, Sep. 1, 1994.
[51] Int. Cl.⁶ .................................................. H01L 21/28
[52] U.S. Cl. ........................ 438/453; 438/647; 438/649; 438/934
[58] Field of Search ................................ 437/192, 193, 437/200

[56] References Cited

U.S. PATENT DOCUMENTS 5,589,417  12/1996  Jeng ........................................ 437/193

Primary Examiner—John Niebling
Assistant Examiner—Thomas G. Bilodeau
Attorney, Agent, or Firm—George O. Saile; Graham S. Jones, II

[57] ABSTRACT

A method for producing an interconnect on a semiconductor device has silicon containing conductive surfaces and dielectric surfaces. The process includes forming separate regions of a blanket first refractory metal silicide on the silicon containing conductive surfaces, the first refractory metal silicide being composed of a first refractory metal and silicon from the surfaces, forming a blanket second refractory metal layer over the device, forming a blanket α-Si layer over the second refractory metal layer, forming a mask over the device to pattern an interconnect between the separate regions, then etching away the unwanted portions of the refractory metal layers and the α-Si layer, performing a rapid thermal annealing process on the device forming a low resistance refractory metal silicide between the α-Si layer and the second refractory metal layer, and then etching away the unwanted portions of the refractory metal layers that are not covered by the refractory metal silicide.

19 Claims, 5 Drawing Sheets

METHOD FOR MAKING ELECTRICAL LOCAL INTERCONNECTS

The application is a continuation, of application Ser. No. 08/299,457 filed on Sep. 1, 1994.

BACKGROUND OF THE INVENTION

1. Field of the Invention

This invention relates to the process for forming local interconnects and to interconnects produced by the process. More particularly, it relates to such interconnects which serve as a diffusion barrier.

2. Description of Related Art

A current method of fabricating local interconnection structures between two semiconductor regions uses a conductive material composed of silicide material that is also employed as a diffusion barrier.

U.S. Pat. No. 5,266,156 of Nasr for "Method of Forming a Local Interconnect and a High Resistor Polysilicon Load by Reacting Cobalt with Polysilicon" states at Col. 1, line 51 as follows:

"Another technique has been suggested by Deveraux et al. in, 'A New Device Interconnect Scheme For Sub-Micron VLSI,' 84 IEDM pages 118–121. In this technique, a thin layer of refractory metal and amorphous silicon are deposited sequentially and in the the same pumpdown. The amorphous silicon is patterned and then the wafer is annealed whereby the refractory metal reacts with the amorphous silicon as well as single crystal silicon and polysilicon to form a silicide. The unreacted metal is then removed by wet etching.

"This technique suffers from limitations such as oxidation of the titanium film during the silicon dry etch which contains oxygen species. Additionally, the photoresist stripping agent showed a tendency for attacking the refractory metal which in this case was titanium."

Nasr shows forming a $CoSi_2$ layer over a source/drain region and another $CoSi_2$ layer over a polysilicon gate which is supported on a FOX structure on the semiconductor substrate. The $CoSi_2$ layer is formed by sputtering cobalt onto the device followed by a rapid thermal anneal which consumes some of the silicon in the source/drain region and the polysilicon gate. The remaining cobalt which does not form $CoSi_2$ is etched away. A second higher temperature heat treatment follows to convert the $CoSi_2$ to a low resistivity material. Then a thin layer of LPCVD polysilicon or amorphous silicon film is applied to the device, which is patterned with a mask and etched into the shape of a desired interconnect between the two $CoSi_2$ structures. Then a second layer of cobalt is applied and subjected to heating to form more $CoSi_2$ to form the local interconnect. The remainder of the cobalt is removed by etching.

U.S. Pat. No. 5,173,450 of Wei for "Titanium Silicide Local Interconnect Process" and U.S. Pat. No. 5,204,279 of Chan et al for "Method of Making SRAM Cell and Structure with Polycrystalline P-Channel Load Devices" show a local interconnect structure and process for forming such a structure.

Sze, VLSI Technology, McGraw-Hill Book Company, (Second Edition 1988), p. 381 states "Refractory silicides, formed on top of polysilicon, have provided the highest compatibility. Disilicides of molybdenum $(MoSi_2)$,[10] tantalum $(TaSi_2)$,[11] and tungsten $(WSi_2)$[12] have been developed and have found their way into production of microprocessors and random-access memories. More recently, $TiSi_2$[13,14] and $CoSi_2$[15] have been suggested to replace $MoSi_2$, $TaSi_2$, and $WSi_2$. Aluminum and refractory metals tungsten and molybdenum are also being considered for the gate metal.[16–18]"

Uyemura "Fundamentals of MOS Digital Integrated Circuits" p. 249 (1988) "Metal layers are used to provide low-resistance interconnects . . . .

"Refractory (high temperature) metals are finding increasing use in VLSI structures. The main advantage of using a refractory metal is that low-resistance patterned interconnect levels can be formed at any time in the chip process flow. The high melting point associated with these metals keeps the pattern intact even if the wafer is subjected to additional heat treatments. (Al has a low melting point—600[° C.]—and can be used only after all the high-temperature cycles are completed.) This property allows for multiple-level interconnects to be created, which aids in the layout of complex chips. Refractory metals of current interest include titanium (Ti), platinum (Pt), molybdenum (Mo), and tungsten (W). These may be evaporated using electron-beam heating or may be sputtered onto the wafer. In sputtering, an inert gas such as argon (Ar) is ionized and used to bombard an electrode that is coated with the desired substance. The collisions knock the atoms off the electrode, creating a particle flux directed towards the wafer."

SUMMARY OF THE INVENTION

In accordance with this invention, an alternative method is employed to further reduce the resistance of interconnection structures. In accordance with this invention, a combined diffusion barrier and local interconnection structure is provided with a low overall interconnection resistance.

In accordance with this invention, a method is provided for producing an interconnect on a semiconductor device having silicon containing conductive surfaces and dielectric surfaces, forming separate regions of a blanket first refractory metal silicide on the silicon containing conductive surfaces, the first refractory metal silicide being composed of a first refractory metal and silicon from the surfaces, forming a blanket second refractory metal layer over the device, forming a blanket α-Si layer over the second refractory metal layer, forming a mask over the device to pattern an interconnect between the separate regions, then etching away the unwanted portions of the refractory metal layers and the α-Si layer, performing a rapid thermal annealing process on the device forming a low resistance refractory metal silicide between the α-Si layer and the second refractory metal layer, and then etching away the unwanted portions of the refractory metal layers that are not covered by the refractory metal silicide.

Preferably, the second refractory metal comprises titanium, has a thickness from thickness from about 200 Å to about 300 Å, and is formed within a temperature range from about 180° C. to about 220° C.

Preferably, the α-Si layer has a thickness from thickness from about 400 Å to about 600 Å and is formed within a temperature range from about 450° C. to about 550° C.

In accordance with another aspect of this invention, a method of producing a semiconductor device comprises:

forming a dielectric structure on a semiconductor substrate, forming a silicon containing conductor structure on the dielectric structure, forming a first refractory metal layer extending above the conductor structure across the dielectric structure, performing a rapid thermal annealing process on the device forming a first low resistance refractory metal silicide between the silicon containing conductor and the first refractory metal layer, forming a second refractory metal layer extending above the conductor structure across the dielectric structure, forming an α-Si layer over the second refractory metal layer, forming a mask over the device to pattern an interconnect and for etching away the unwanted portions of the α-Si layer, performing a rapid thermal annealing process on the device forming a second low resistance refractory metal silicide between the α-Si layer and the second refractory metal layer, and then etching away the unwanted portions of the second refractory metal layer that are not covered by the second refractory metal silicide.

Preferably, the second refractory metal comprises titanium.

Preferably, the second refractory metal layer has a thickness from thickness from about 200 Å to about 300 Å, formed at a temperature range from about 180° C. to about 200° C.

Preferably, the α-Si layer has a thickness from thickness from about 400 Å to about 600 Å formed at a temperature range from about 450° C. to about 550° C.

In accordance with another aspect of this invention, a semiconductor device having silicon containing conductive surfaces and dielectric surfaces with an interconnect between a pair of the conductive surfaces, a dielectric structure on a semiconductor substrate, a silicon containing conductor structure on the dielectric structure, first refractory metal silicide layer structures extending above the conductor structure and above another one of the conductive surfaces across the dielectric structure, the metal silicide structures being formed by rapid thermal annealing of the silicon containing conductor and the first refractory metal layer, and a refractory metal silicide interconnect from a second refractory metal layer extending above the conductor structure across the dielectric structure combined by rapid thermal annealing with an α-Si layer over the second refractory metal layer, the interconnect being stacked upon the first refractory metal layer at one end and being in contact with another conductive surface.

Preferably, the first refractory metal silicide comprises $TiSi_2$; and the second refractory metal silicide comprises $TiSi_2$.

Preferably, the second refractory metal silicide layer has a thickness from thickness from about 600 Å to about 900 Å.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

An embodiment of this invention comprises a method which produces a device in accordance with this invention. A preferred embodiment of the process illustrating the device produced by that process is described next.

PROCESS

A conventional CMOS/BiCMOS process is performed to produce transistors with a sidewall spacer on each side of polysilicon gate electrodes.

Figure 1:
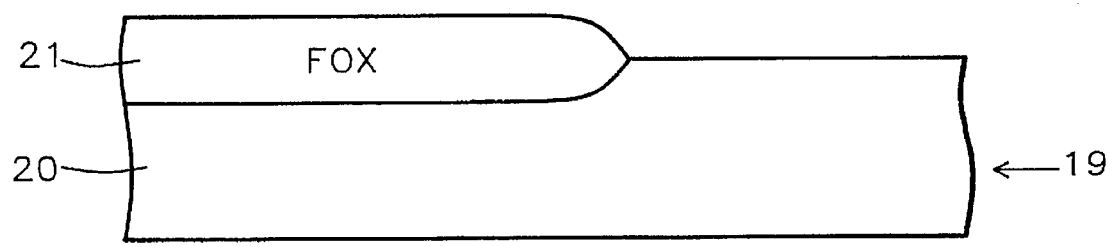
FIG. 1 shows a device composed of a lightly doped silicon semiconductor substrate upon which a field oxide (FOX) region has been formed over a portion of the surface of the substrate with the remainder thereof remaining exposed.

FIG. 1 shows a device 19 composed of a lightly doped silicon semiconductor substrate 20 upon which a field oxide (FOX) region 21 has been formed over a portion of the surface of the substrate 20 with the remainder thereof remaining exposed.

Figure 2:
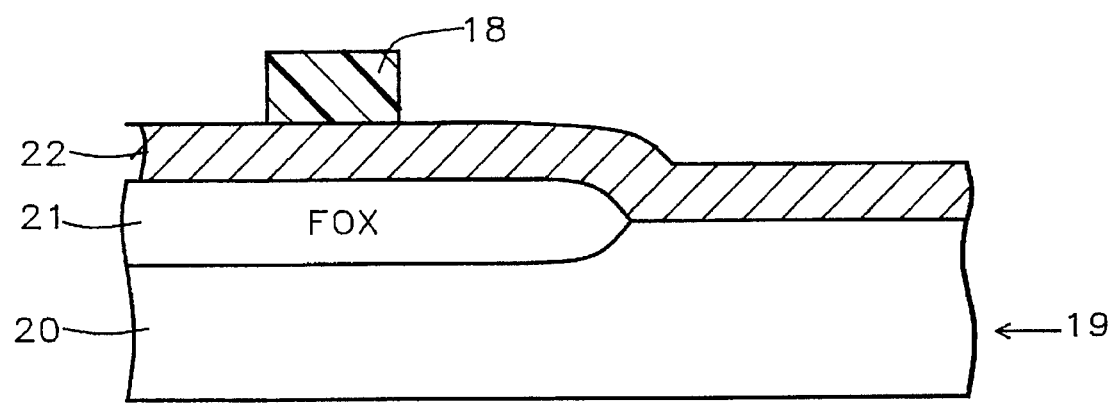
FIG. 2 shows the device of FIG. 1 with a blanket polysilicon layer formed over the exposed portions of the substrate and over the FOX region, over which a narrow photoresist mask is formed for etching away unwanted portions of the polysilicon layer to configure a polysilicon conductor.

FIG. 2 shows the device of FIG. 1 with a blanket polysilicon layer 22 formed over the exposed portions of substrate 20 and over the FOX region 21.

Over the polysilicon layer 22 is formed a narrow photoresist mask 18 patterned by a conventional photolithographic process.

Then the mask 18 is used during etching away of the unwanted portions of polysilicon layer 22 to form the desired configuration of polysilicon conductor 22.

Figure 3:
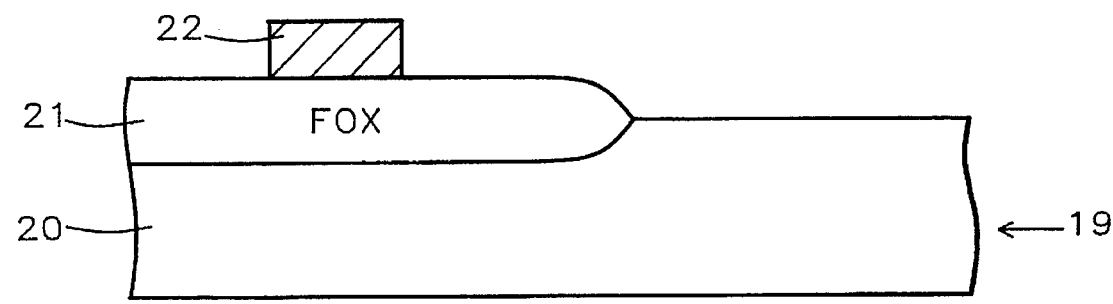
FIG. 3 shows the device of FIG. 2 with the polysilicon conductor above the FOX region after the etching into the desired configuration using the conventional process of RIE.

FIG. 3 shows the device of FIG. 2 with the polysilicon conductor 22 above the FOX region 21 after the etching into the desired configuration using the conventional process of RIE (reactive ion etching) with preferred parameters of Cl$_2$:HBr~3:1~300 mTorr, ~200 Watts.

Figure 4:
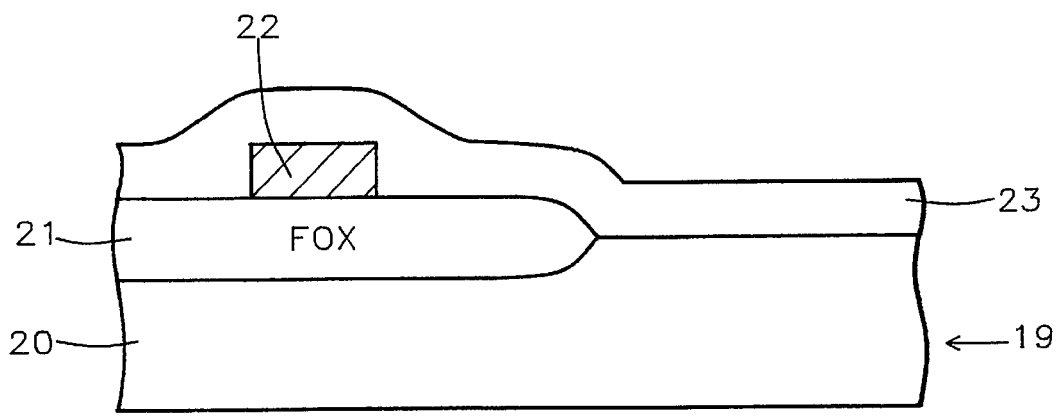
FIG. 4 shows the device of FIG. 3 after formation of a blanket spacer silicon dioxide layer on the device by blanket deposition of a spacer silicon dioxide layer.

FIG. 4 shows the device of FIG. 3 after formation of a blanket spacer silicon dioxide layer 23 on device 19 by means of a conventional process of blanket deposition of spacer silicon dioxide layer 23 is performed. Spacer layer 23 is formed with a thickness from about 1,500 Å to about 2,000 Å, by means of the LPCVD process in a furnace chamber at a temperature within the range from about 600° C. to about 750° C., at a pressure within the range from about 0.5 Torr to about 1 Torr.

Figure 5:
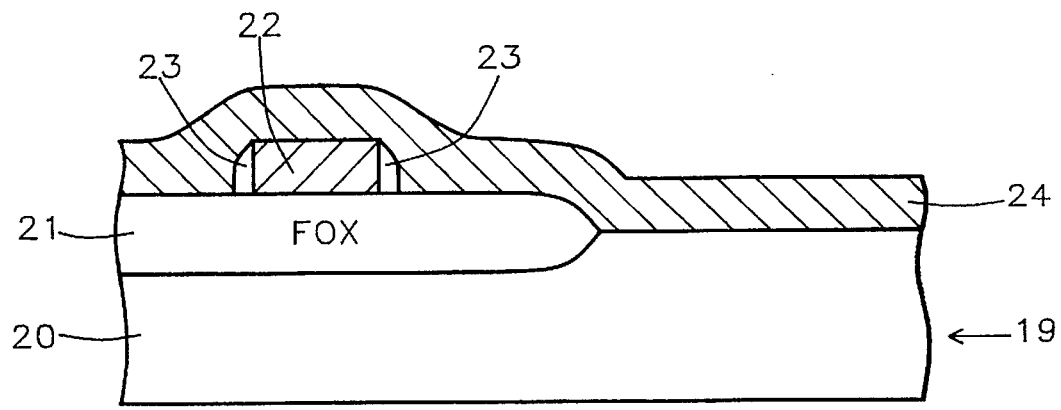
FIG. 5 shows the device of FIG. 4 after two additional steps including of etching of the spacer silicon dioxide layer and blanket deposition of a first refractory metal layer.

FIG. 5 shows the device of FIG. 4 after two additional steps. First a conventional process of etching of spacer silicon dioxide layer 23 is performed. The formation of spacer structures 23 from blanket spacer silicon dioxide layer 23 is accomplished by etching using the conventional spacer etching process which has the preferred parameters of CHF$_2$:CF$_4$~1:1~700 mTorr, ~400 Watts.

Then a blanket, first refractory metal layer 24 is deposited. The first refractory metal layer 24 is composed of one of a group of metals known as refractory metals, each of which has the ability to retain its physical shape and chemical identity when subjected to high temperatures. Possible refractory metals for use in this connection include aluminum (Al), cobalt (Co), molybdenum (Mo), platinum (Pt), tantalum (Ta), titanium (Ti), and tungsten (W).

The blanket first refractory metal layer 24 is formed with a thickness from about 400 Å to about 500 Å, by means of the PVD process in a sputtering chamber at a temperature within the range from about 180° C. to about 220° C., at a pressure within the range from about 2 mTorr to about 4 mTorr.

Figure 6:
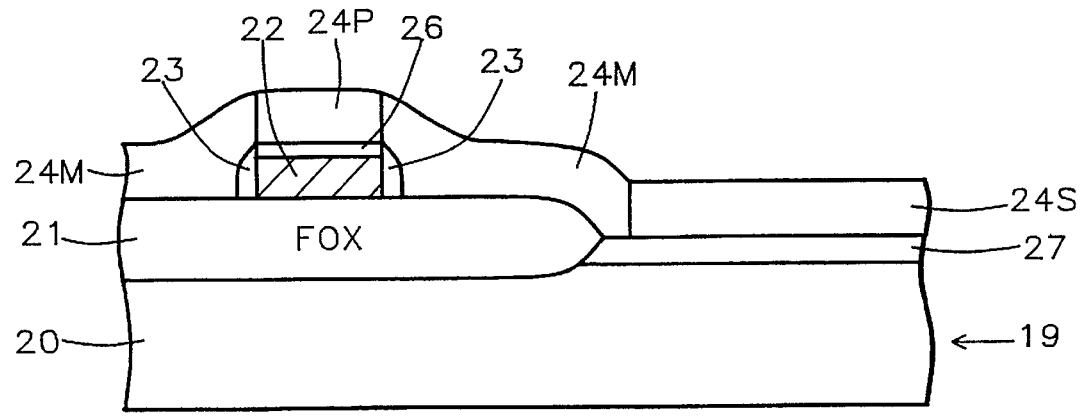
FIG. 6 shows the product of FIG. 5 after a rapid thermal anneal (RTA) process performed to cause the refractory metal in the first refractory metal layer to combine to form a refractory metal silicide in regions where the refractory metal contacts silicon.

Referring to FIG. 6, the product of FIG. 5 is shown after a rapid thermal anneal (RTA) process was performed to cause the refractory metal in the first refractory metal layer 24 to combine to form a refractory metal silicide 24P and 24S in regions where the refractory metal contacts silicon. The RTA process is performed with a furnace in a vacuum chamber at a temperature ranging from about 650° C. to about 680° C. for a time from about 30 sec. to about 60 sec. As a result, the upper region 26 of polysilicon conductor 22 has been converted to a refractory metal silicide such as CoSi$_2$, MoSi$_2$, TiSi$_2$, TaSi$_2$, and WSi$_2$ which has a resistivity of about 15Ω-cm similar to the about 15Ω-cm for the CoSi$_2$ of the Nasr patent. The same result occurs in region 27 which has been converted to a refractory metal silicide in and below the surface of the silicon substrate 20 to a depth of about 200 Å, below the portion of previously first refractory metal layer 24 now identified as refractory metal silicide layer 24S. After the RTA process the composition of layer 24S is a refractory metal silicide (for example TiSi$_2$ where layer 24 was Ti) and the thickness is from about 400 Å to about 500 Å.

In the region 24M formed from the portion of first refractory metal layer 24 above the spacers 23 and field oxide region 21, the RTA process concurrently causes refractory metal to form an oxysilicide/nitride where the refractory metal is in contact with the silicon dioxide materials. The resistivity of the oxysilicide/nitride layer 24M (which is not a dielectric) is about 70Ω-cm. The type of RTA chamber is a single wafer system with a radiant lamp energy source, argon or nitrogen gases, treated for a time range from about 30 seconds to about 60 seconds.

Sze, VLSI Technology, McGraw-Hill Book Company, (Second Edition 1988), p. 359–362 has a section of RTA which states as follows:

"RTA can be divided into three classes: adiabatic, thermal flux, and isothermal heating .... In adiabatic annealing, the heating time is so short (less than 10$^{-7}$s) that only a thin surface film is affected. A high-energy laser pulse is used to melt the surface to depth of less than 1 μm, and the surface recrystallizes by liquid phase epitaxy with no memory of the previous damage. Dopant diffusion in the liquid state is very fast so the final profile is roughly rectangular, extending from the surface to the melt depth. By adjusting the pulse time and energy, shallow junctions can be obtained, but It is not possible to preserve other doping profiles or surface films, so the technique is not generally applicable to VLSI."

Figure 7:
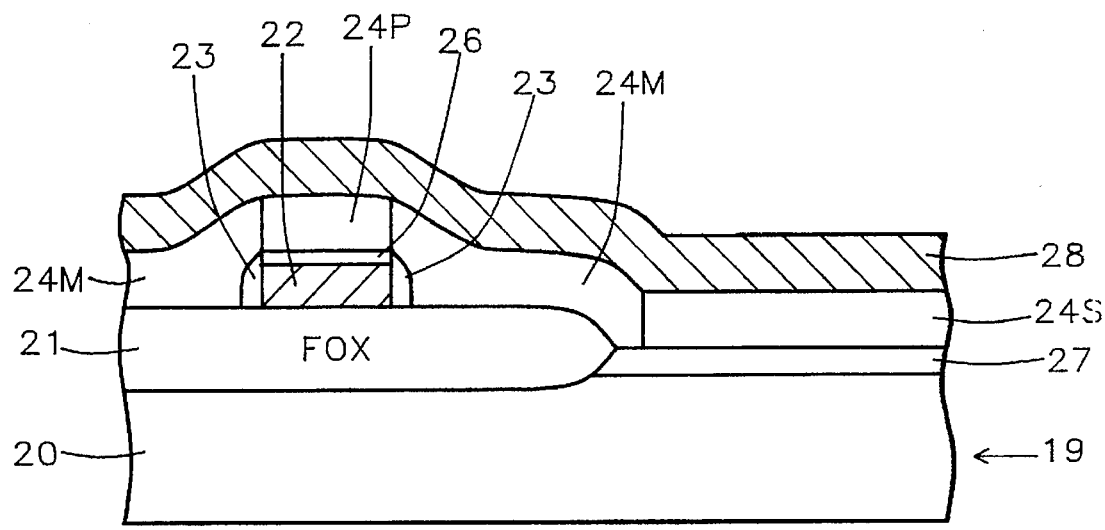
FIG. 7 shows the product of FIG. 6 after a second blanket refractory metal layer is deposited on the device of FIG. 6.

Referring to FIG. 7, a second blanket refractory metal layer 28 composed of aluminum (Al), cobalt (Co), molybdenum (Mo), platinum (Pt), tantalum (Ta), titanium (Ti), and tungsten (W) is deposited on the device of FIG. 6 by the method of PVD, thickness from about 200 Å to about 300 Å, temperature range from about 180° C. to about 220° C.

Figure 8:
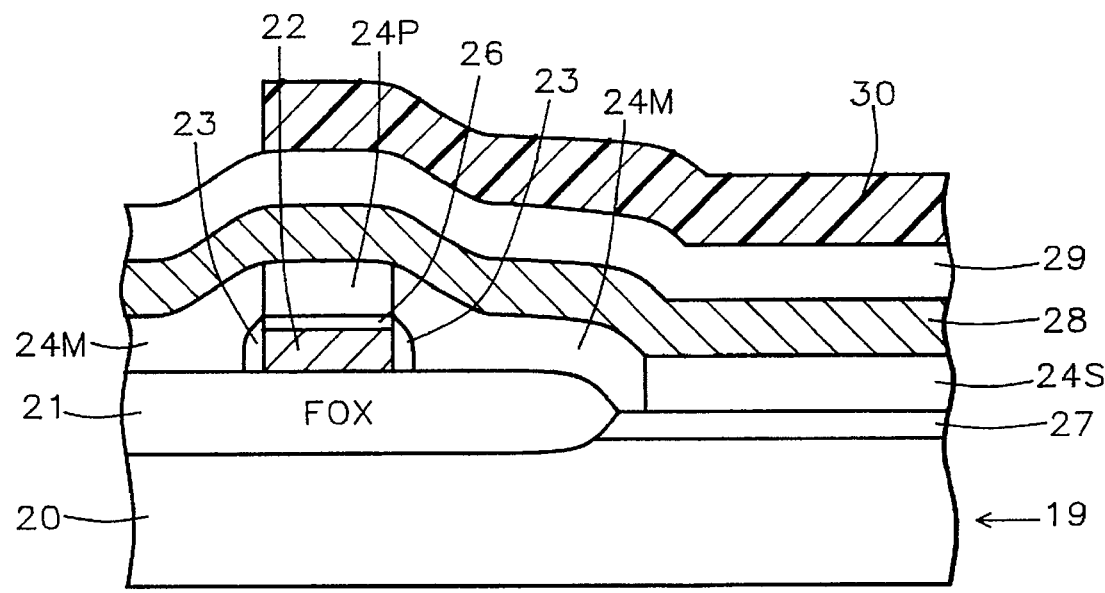
FIG. 8 shows the product of FIG. 7 after an amorphous silicon (α-Si) layer is deposited thereon and patterned by photolithographic techniques produced by forming a mask followed by etching.

In FIG. 8, an amorphous silicon (α-Si) layer 29 is deposited upon the product shown in FIG. 7. The amorphous silicon layer is formed with a thickness from about 400 Å to about 600 Å, by means of the LPCVD process in a single-wafer chamber at a temperature within the range from about 450° C. to about 550° C. at a pressure within the range from about 70 Torr to about 100 Torr.

The α-Si layer 29 is patterned by applying a patterned photoresist mask 30 which is formed by conventional photolithographic techniques. Then the α-S layer 29 is etched in the pattern of said mask using the refractory metal as an etch stop, using Cl/HBr chemistry with a selectivity greater than "5" and the second titanium layer 28 providing an etch stop layer 28.

Figure 9A:
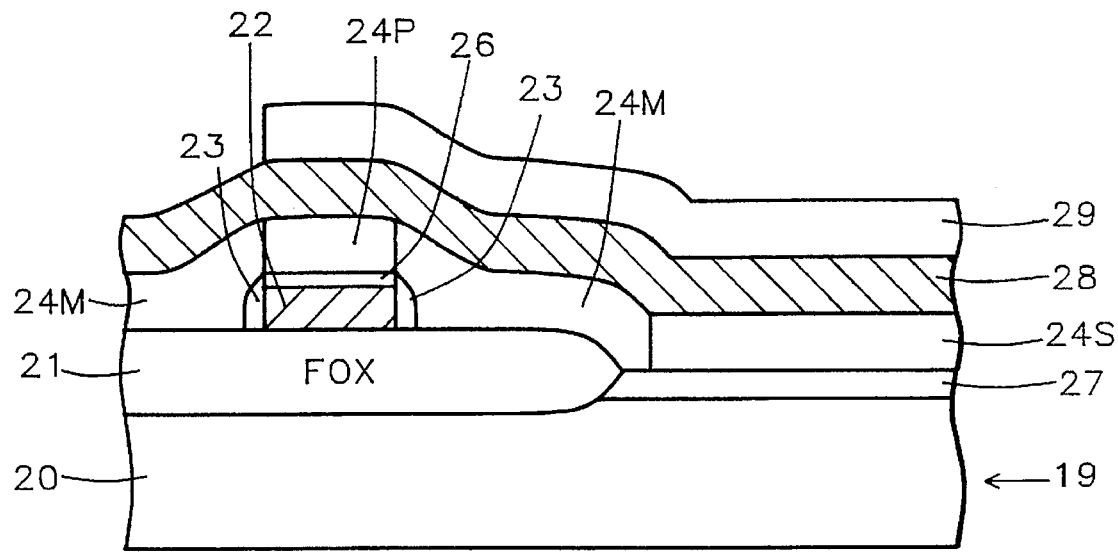
FIG. 9A shows the product of FIG. 8 after the resist mask is stripped.

Then the resist mask 30 is stripped using a conventional photoresist stripping technique which comprises conventional dry etching using oxygen gas (O$_2$) ashing resulting in the product shown in FIG. 9A.

Figure 9B:
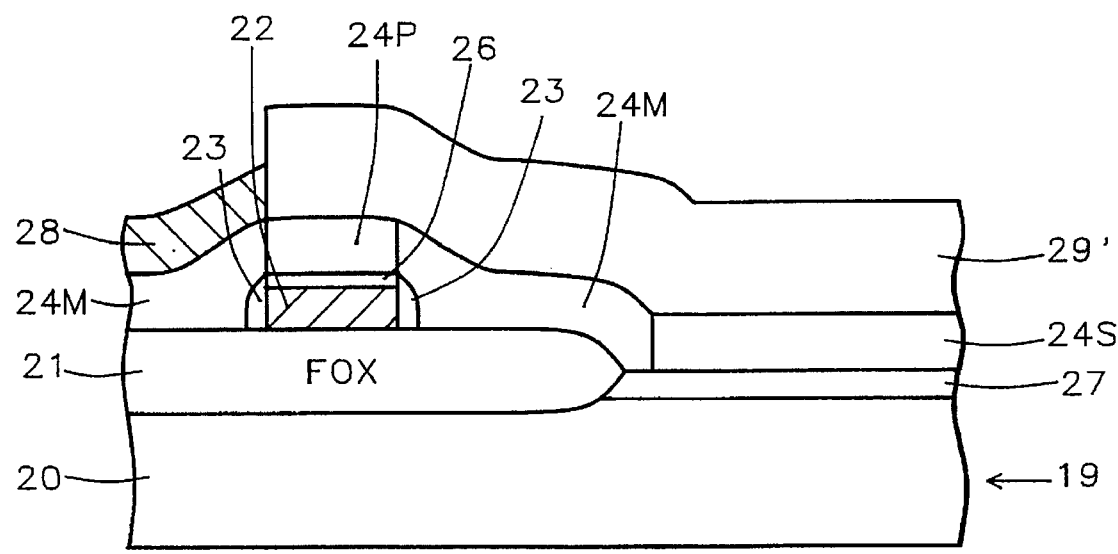
FIG. 9B shows the product of FIG. 9A after a second rapid thermal anneal (RTA) process has been performed in a single wafer chamber with radiant energy to combine to form a refractory metal silicide layer.

Referring to FIG. 9B, a second rapid thermal anneal (RTA) process has been performed in a single wafer chamber with radiant energy at a temperature ranging from about 650° C. to about 680° C. to cause the second refractory metal layer 28 to combine to form a refractory metal silicide layer 29' having a thickness from about 600 Å to about 900 Å formed from α-Si layer 29 above and the second refractory metal layer 28 below. The RTA is performed producing a metal silicide layer 29'.

Figure 9C:
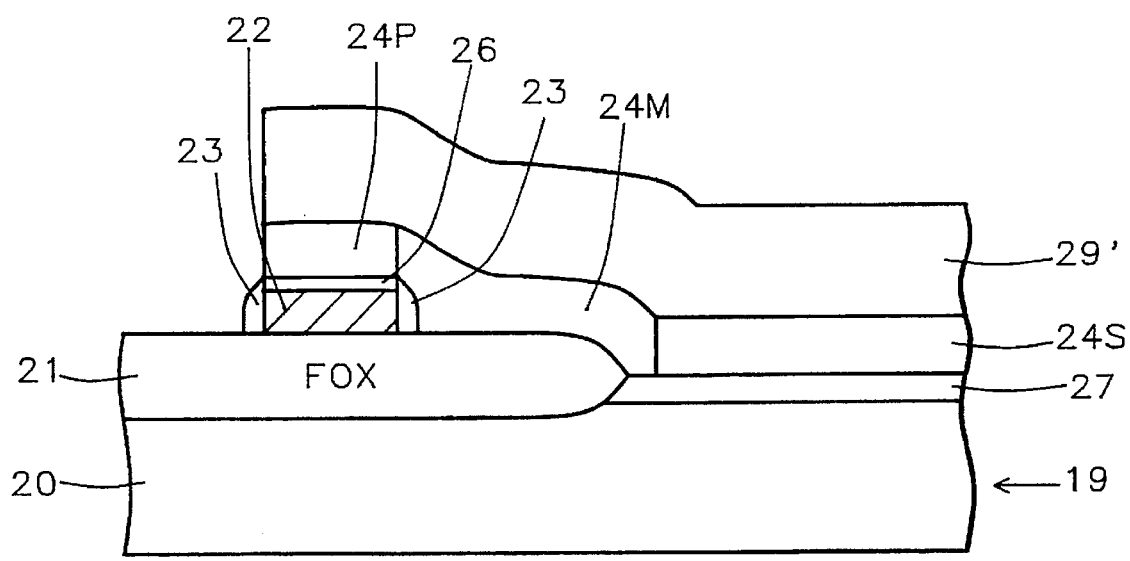
FIG. 9C shows the product of FIG. 9B after a wet etch has been performed to remove the remaining titanium which was not covered by the α-Si layer.

Referring to FIG. 9C a wet etch is performed to remove the remaining titanium 28 which was not covered by the α-Si layer 29 (where the TiSi$_2$ layer 29' has been formed).

The result of this process is a refractory silicide conductor 29' connected to a refractory metal silicide region 24P which is formed on the surface of the refractory metal region in the upper region 26 of polysilicon conductor 22. Conductor 29' has a resistivity of about 15 Ω-cm which is the same as the resistivity of CoSi$_2$ of Nasr 15 Ω-cm. The other end of layer 29' is in contact with a refractory metal silicide layer 24P which overlies the refractory metal silicide region 27 in substrate 20. Thus, a combined diffusion barrier and local interconnection structure is provided with a low overall interconnection resistance.

As stated above, the exposed portion of region 24M (which comprises an oxysilicide/nitride formed from the portion of first refractory metal layer 24 above the spacers 23 and field oxide region 21) is removed by etching.

The polysilicon layer 22 is connected to the substrate 20 by the interconnect.

The diffusion barrier is preferably titanium nitride.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of producing an interconnect on a semiconductor substrate composed of doped silicon having a surface, said surface of said silicon substrate having a first portion and a second portion, with a field oxide region formed over said first portion of said surface, comprising the steps of:

forming a polysilicon conductor over said field oxide region along with silicon dioxide spacers formed over said field oxide region, forming a blanket first refractory metal layer covering said polysilicon conductor, said spacers, said field oxide region and said second portion of said surface of said silicon substrate, performing an annealing step to form a first refractory metal silicide layer having a resistivity of about 15Ω-cm over said polysilicon conductor and over said second portion of said surface of said silicon substrate and to form a refractory metal oxysilicide/nitride layer over said spacers and to form said refractory metal oxysilicide over said field oxide region, said refractory metal oxysilicide having a resistivity of about 70Ω-cm, said first refractory metal silicide being formed by combining said first refractory metal layer with said polysilicon conductor and by combining said first refractory metal layer with said silicon surface and said refractory metal oxysilicide/nitride being formed by combining said refractory metal with said spacers and by combining said refractory metal with said field oxide, forming a blanket second refractory metal layer over said first refractory metal silicide and over said refractory metal oxysilicide/nitride, forming a blanket α-Si layer over said second refractory metal layer, forming a patterned mask over said blanket α-Si layer to pattern an interconnect between separate regions including said polysilicon conductor structure and said semiconductor substrate, then etching away the unwanted portions of said α-Si layer, with the remaining portion of said α-Si layer comprising a patterned portion of said α-Si layer and with said second refractory metal layer serving as an etch stop, performing an annealing process on the device forming said interconnect from said second refractory metal layer and said α-Si layer, said interconnect composed of a second refractory metal silicide having a resistivity of about 15Ω-cm between said patterned portion of said α-Si layer and said second refractory metal layer, and then etching away the unwanted portions of said refractory metal layers that are not covered by said second refractory metal silicide, whereby said interconnect is provided between said polysilicon conductor and said semiconductor substrate.

2. A method in accordance with claim 1 wherein said second refractory metal comprises titanium.

3. A method in accordance with claim 1 wherein said second refractory metal layer has a thickness from about 200 Å to about 300 Å.

4. A method in accordance with claim 1 wherein said first and second refractory metal layers are formed within a temperature range from about 180° C. to about 220° C.

5. A method in accordance with claim 1 wherein said α-Si layer has a thickness from about 400 Å to about 600 Å.

6. A method in accordance with claim 1 wherein said α-Si layer is formed at a temperature range from about 450° C. to about 550° C.

7. A method of producing a semiconductor device with an interconnect, said method comprising:

forming a field oxide dielectric structure on a semiconductor substrate, forming a silicon containing conductor structure on said field oxide dielectric structure, forming spacers on said field oxide dielectric structure adjacent to said conductor structure, forming a first refractory metal layer extending above said conductor structure and said spacers across said field oxide dielectric structure, performing a rapid thermal annealing process in vacuum for a time from about 30 seconds to about 60 seconds on said device forming a first refractory metal silicide having a resistivity of about 15Ω-cm between said silicon containing conductor and said first refractory metal layer and between said silicon substrate and said first refractory metal layer and forming a refractory metal oxysilicide/nitride layer having a resistivity of about 70Ω-cm by combining said refractory metal with said field oxide and with said spacers, forming a blanket second refractory metal layer extending above said conductor structure and above said metal oxysilicide/nitride layer across said dielectric structure, forming an α-Si layer over said second refractory metal layer, forming a mask over said α-Si layer to pattern an interconnect, between said silicon containing conductor structure and said semiconductor substrate, in said α-Si layer by etching away the unwanted portions of said α-Si layer through said mask, stripping away said mask, performing a thermal annealing process on the device forming a second refractory metal silicide between said α-Si layer and said second refractory metal layer, and then etching away the unwanted portions of said second refractory metal layer that are not covered by said second refractory metal silicide, whereby said interconnect is provided between said silicon containing conductor structure and said semiconductor substrate.

8. A method in accordance with claim 7 wherein said second refractory metal comprises titanium.

9. A method in accordance with claim 7 wherein said second refractory metal layer has a thickness from about 200 Å to about 300 Å.

10. A method in accordance with claim 7 wherein said said first and said second refractory metal layers are formed at a temperature range from about 180° C. to about 200° C.

11. A method in accordance with claim 7 wherein said α-Si layer has a thickness from about 400 Å to about 600 Å.

12. A method in accordance with claim 7 wherein said α-Si layer is formed within a temperature range from about 450° C. to about 550° C.

13. A method of producing an interconnect on a semiconductor substrate composed of doped silicon having a surface, said surface of said silicon substrate having a first portion and a second portion, a field oxide region formed over said first portion of said surface, a polysilicon conductor structure with spacers formed over said field oxide region, comprising the steps of:

forming a blanket first metal layer having a thickness from about 400 Å to about 500 Å at a temperature from about 180° C. to about 220° C., said first metal layer being composed of a material selected from the group consisting of aluminum, cobalt, molybdenum, platinum, tantalum, titanium, and tungsten, said first metal layer covering said polysilicon conductor structure, said spacers, said field oxide region and said silicon substrate, performing a rapid thermal annealing step of combining said first metal layer with said polysilicon conductor structure and said silicon surface by performing said annealing step in the presence of nitrogen gas in vacuum for a time from about 30 seconds to about 60 seconds to form a first metal silicide layer having a resistivity of about 15Ω-cm, said first metal silicide being composed of said first metal and silicon from surfaces of said polysilicon conductor structure and over said second portion of said surface of said silicon substrate and forming a first metal oxysilicide/nitride layer over said field oxide region and over said spacers, said oxysilicide/nitride layer having a resistivity of about 70Ω-cm and being composed of said first metal and oxide from said field oxide region and from said spacers, forming a blanket second metal layer having a thickness from about 200 Å to about 300 Å at a temperature from about 180° C. to about 220° C., said second metal layer being composed of a material selected from the group consisting of aluminum, cobalt, molybdenum, platinum, tantalum, titanium, and tungsten, said second metal being formed over said first metal silicide and over said first metal oxysilicide/nitride, forming a blanket α-Si layer over said second metal layer, forming a mask over said blanket α-Si layer to initiate patterning of an interconnect between said polysilicon conductor structure and said semiconductor substrate, then etching away the unwanted portions of said α-Si layer which are unprotected by said mask with said second metal layer serving as an etch stop, performing a thermal annealing process on the device forming a low resistance metal silicide between said α-Si layer and said second metal layer, said low resistance metal layer having a resistance of about 15 Ω-cm, and then etching away the unwanted portions of said metal layers that are not covered by said metal silicide, whereby said interconnect is provided between said polysilicon conductor structure and said semiconductor substrate.

14. A method in accordance with claim 13 wherein said second refractory metal comprises titanium.

15. A method in accordance with claim 13 wherein said α-Si layer has a thickness from about 400 Å to about 600 Å.

16. A method in accordance with claim 13 wherein said layer is formed within a temperature range from about 450° C. to about 550° C.

17. A method in accordance with claim 14 wherein said α-S layer has a thickness from about 400 Å to about 600 Å.

18. A method in accordance with claim 17 wherein said α-Si layer is formed within a temperature range from about 450° C. to about 550° C.

19. A method in accordance with claim 13 wherein said second refractory metal comprises titanium said α-Si layer has a thickness from about 400 Å to about 600 Å, and said α-Si layer is formed within a temperature range from about 450° C. to about 550° C.

* * * * *